(12) United States Patent
Mao et al.

(10) Patent No.: US 7,902,618 B2
(45) Date of Patent: Mar. 8, 2011

(54) BACKSIDE ILLUMINATED IMAGING SENSOR WITH IMPROVED ANGULAR RESPONSE

(75) Inventors: Duli Mao, Sunnyvale, CA (US); Vincent Venezia, Sunnyvale, CA (US); Hsin-Chih Tai, Cupertino, CA (US); Yin Qian, Milpitas, CA (US); Howard E. Rhodes, San Martin, CA (US)

(73) Assignee: Omni Vision Technologies, Inc., Santa Clara, CA (US)

( * ) Notice: Subject to any disclaimer, the term of this patent is extended or adjusted under 35 U.S.C. 154(b) by 200 days.

(21) Appl. No.: 12/272,677

(22) Filed: Nov. 17, 2008

(65) Prior Publication Data

US 2010/0123069 A1 May 20, 2010

(51) Int. Cl.
*H01L 27/14* (2006.01)
(52) U.S. Cl. .............................. 257/431; 257/292; 438/59
(58) Field of Classification Search .................. 257/292, 257/431; 438/59
See application file for complete search history.

(56) References Cited

U.S. PATENT DOCUMENTS

| | | | | |
|---|---|---|---|---|
| 3,617,753 | A * | 11/1971 | Kato et al. | 257/443 |
| 6,521,925 | B1 * | 2/2003 | Mori et al. | 257/292 |
| 6,638,786 | B2 | 10/2003 | Yamamoto | |
| 6,884,985 | B2 | 4/2005 | Raynor | |
| 2005/0087829 | A1 * | 4/2005 | Merrill et al. | 257/440 |
| 2005/0167708 | A1 * | 8/2005 | Rhodes et al. | 257/291 |
| 2006/0006438 | A1 | 1/2006 | Maruyama | |
| 2006/0197007 | A1 | 9/2006 | Iwabuchi et al. | |
| 2007/0069258 | A1 | 3/2007 | Ahn | |
| 2008/0011936 | A1 | 1/2008 | Kuo et al. | |
| 2008/0211050 | A1 | 9/2008 | Tay | |
| 2009/0189234 | A1 * | 7/2009 | Mabuchi | 257/432 |

OTHER PUBLICATIONS

PCT/US2009/064071—International Search Report and Written Opinion, dated Feb. 26, 2010. (12 pages).

* cited by examiner

*Primary Examiner* — Ahmed Sefer

(74) *Attorney, Agent, or Firm* — Blakely Sokoloff Taylor & Zafman, LLP

(57) ABSTRACT

A backside illuminated imaging pixel with improved angular response includes a semiconductor layer having a front and a back surface. The imaging pixel also includes a photodiode region formed in the semiconductor layer. The photodiode region includes a first and a second n-region. The first n-region has a centerline projecting between the front and back surfaces of the semiconductor layer. The second n-region is disposed between the first n-region and the back surface of the semiconductor layer such that the second n-region is offset from the centerline of the first n-region.

19 Claims, 7 Drawing Sheets

BACKSIDE ILLUMINATED IMAGING SENSOR WITH IMPROVED ANGULAR RESPONSE

TECHNICAL FIELD

This disclosure relates generally to imaging sensors, and in particular but not exclusively, relates to backside illuminated imaging sensors.

BACKGROUND INFORMATION

Many semiconductor imaging sensors today are front side illuminated. That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated imaging sensors are an alternative to front side illuminated imaging sensors that address the fill factor problems associated with front side illumination. Backside illuminated imaging sensors include arrays of pixels that are fabricated on the front surface of the semiconductor wafer, but receive light through a back surface of the wafer. Color filters and micro-lenses may be included on the back surface of the wafer in order to improve the sensitivity of the backside illuminated sensor. However, the sensitivity of a pixel in the array varies depending on its location within the array. For example, a pixel located at or near the center of the array may have a high sensitivity due to incident light near the center of the array being normal to the back surface of the sensor. While pixels at or near the center of the array may have a high sensitivity, pixels that are located away from the center of the array may have a lower sensitivity due to the titled angle of the incident light relative to the back surface of the sensor. This variance in sensitivities across the pixel array is often referred to as "sensitivity roll off" and may result in irregular white balance and poor color uniformity of the image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Sensor with Improved Angular Response are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In short, embodiments of the present invention include offsetting various elements of a backside illuminated imaging sensor to improve angular response. The offsetting of various elements of the imaging sensor further improves the color response of a color backside illuminated imaging sensor. These and other embodiments are described in detail below.

Figure 1:
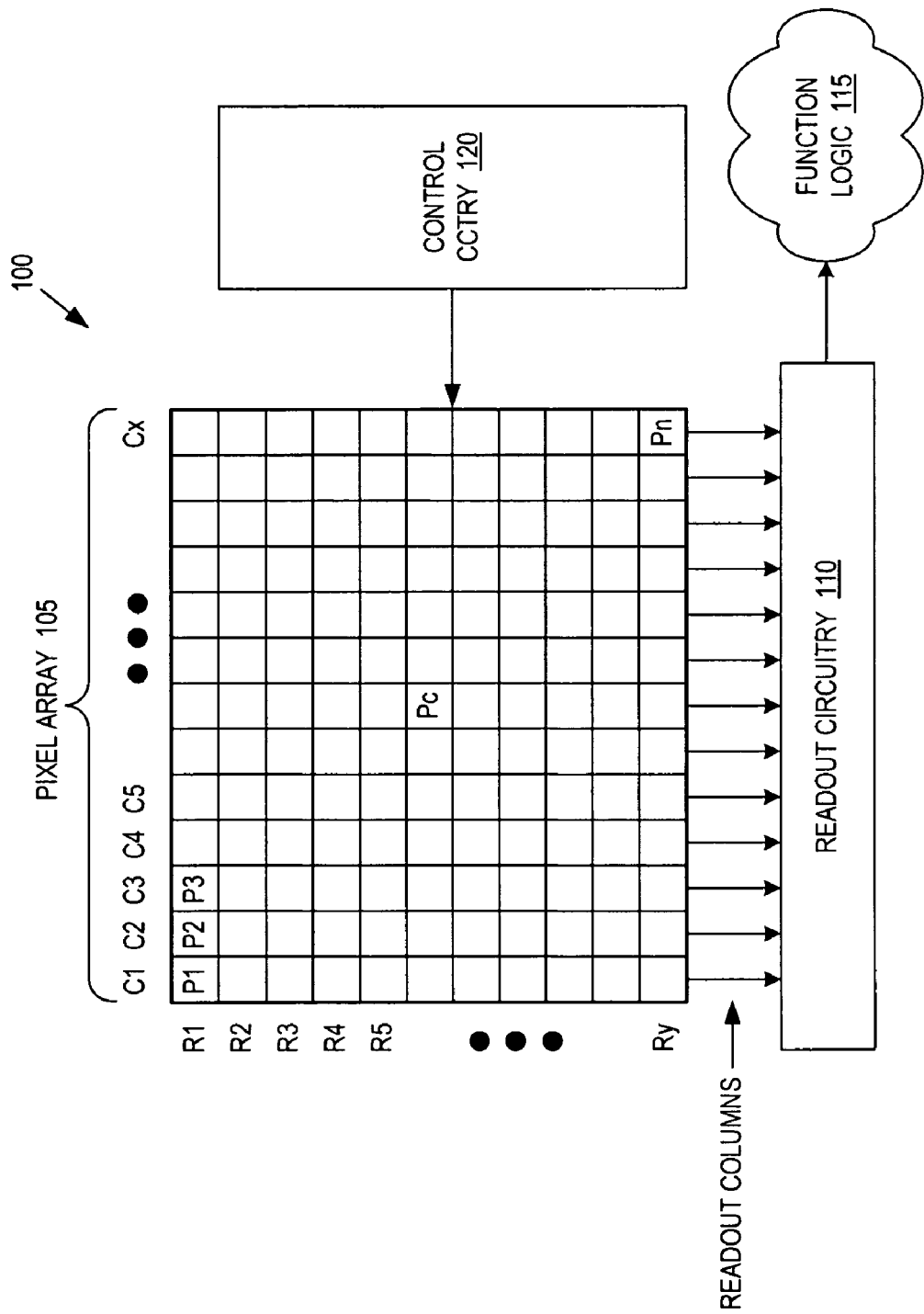
FIG. 1 is a block diagram illustrating a backside illuminated imaging sensor, in accordance with an embodiment of the invention

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. Pixel Pc is illustrated as a center pixel of pixel array 105. In one example, for a pixel array that includes an odd number of columns or rows, a center pixel is a pixel that includes the same number of pixels to its left as it does to its right and also the same number of pixels positioned above it as there are below it. In another example, for a pixel array that includes an even number of columns or rows, pixel array 105 may include several pixels grouped about a center point of the array.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
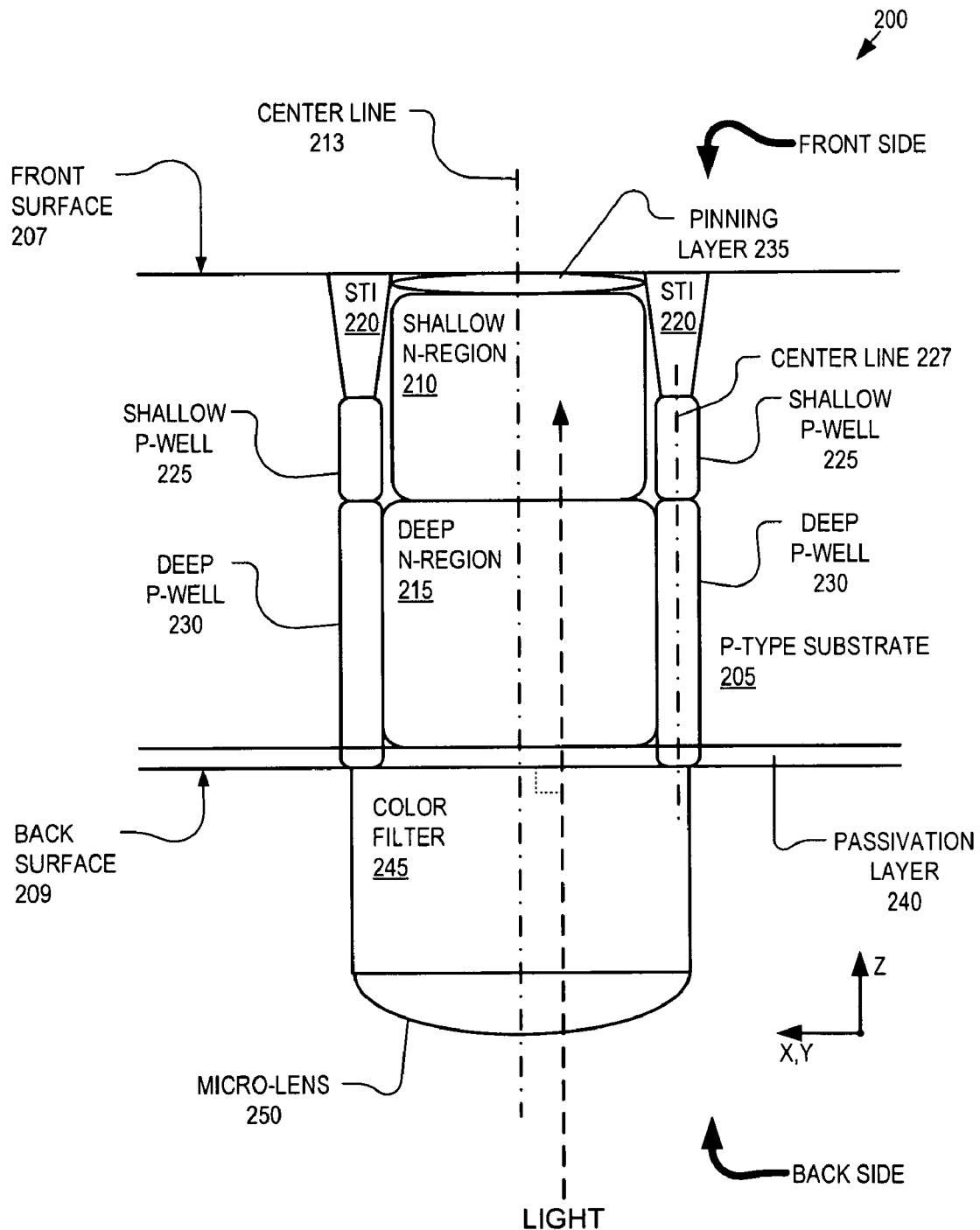
FIG. 2 is a cross-sectional view of an imaging pixel of a backside illuminated imaging sensor, in accordance with an embodiment of the invention.

FIG. 2 is a cross-sectional view of an imaging pixel 200 of a backside illuminated imaging sensor, in accordance with an embodiment of the invention. Imaging pixel 200 is one possible implementation of at least one pixel of pixel array 105, shown in FIG. 1. The illustrated example of imaging pixel 200 includes a p-type substrate 205, a photodiode region (e.g., shallow n-region 210 and deep n-region 215), an isolation region (e.g., shallow trench isolations ("STI") 220, shallow p-well 225, and deep p-well 230), a pinning layer 235, a passivation layer 240, a color filter 245, and a micro-lens 250.

In the illustrated embodiment of FIG. 2, shallow n-region 210 and deep n-region are implanted within substrate 205 from front surface 207 to form a photodiode region. Shallow n-region 210 and deep-n-region 215 are configured to receive light from back surface 209 of substrate 205. In one embodiment deep n-region 215 and shallow n-region 210 are formed using implants of different dopants (e.g., one implant is formed using arsenic as the dopant and the other implant is formed using phosphorus as the dopant). The photodiode region is illustrated as a pinned photodiode by way of optional pinning layer 235. In one embodiment the photodiode region may be an unpinned photodiode or a partially pinned photodiode.

Still referring to FIG. 2, an isolation region of pixel 200 includes STI 220, shallow p-well 225 and deep p-well 230. In one example, the isolation region may include one or more isolation wells. The isolation region is configured to function either independently or in concert with passivation layer 240 to provide a substantially complete isolation well between imaging pixels (e.g., between imaging pixel 200 and an adjacent imaging pixel (not shown)). In one example, passivation layer 240 is a backside P$^+$ layer formed with a dopant such as boron. In one example, shallow P-well 225 is formed in P-type substrate 205 and deep P-well 230 is formed between shallow P-well 225 and back surface 209. Although FIG. 2 illustrates STI 220 as being formed between shallow P-well 225 and front surface 207, STI 220 may be formed within shallow P-well 225, wherein shallow P-well 225 extends between deep p-well 230 and front surface 207. In one example, deep P-well 230 extends to back surface 209 of substrate 205. In another example, deep P-well 230 may not extend all the way to back surface 209 provided passivation layer 240 is sufficiently highly-doped (e.g., with boron).

As shown in FIG. 2, shallow n-region 210 includes a centerline 213. In one embodiment, a projection of centerline 213 extends between front surface 207 and back surface 209. Centerline 213 may also be generally perpendicular to front surface 207, back surface 209, or both. In one embodiment, centerline 213 is a line that bisects a cross-sectional plane of shallow n-region 210. Centerline 213 may bisect a cross-sectional plane of shallow n-region 210 about one or more axes. For example, centerline 213 may bisect a cross-sectional plane of shallow n-region 210 about the x-axis only, about the y-axis only, or about both the x and y axes. In one embodiment, centerline 213 when viewed from front surface 207, may be located at a centroid of shallow n-region 210. That is, a centroid of shallow n-region 210 may be a two-dimensional point, as viewed along the z-axis, where the sum of the displacements of all points of shallow n-region 210 is zero. As shown in the illustrated embodiment of FIG. 2, centerline 213 is a centerline of shallow n-region 210, deep n-region 215, color filter 245 and micro-lens 250. That is, shallow n-region 210, deep n-region 215, color filter 245 and micro-lens 250 all include centerlines which are coincident with one another.

FIG. 2 further illustrates shallow p-well 225 as including a centerline 227. In one embodiment, a projection of centerline 227 extends between front surface 207 and back surface 209. Centerline 227 may also be generally perpendicular to front surface 207, back surface 209, or both. In one embodiment, centerline 227 is a line that bisects a cross-sectional plane of shallow p-well 225. Centerline 227 may bisect a cross-sectional plane of shallow p-well 230 about one or more axes. For example, centerline 227 may bisect a cross-sectional plane of shallow p-well 225 about the x-axis only, about the y-axis only, or about both the x and y axes. In one embodiment, centerline 227 when viewed from front surface 207, may be located at a centroid of shallow p-well 225. That is, a centroid of shallow p-well 225 may be a two-dimensional point, as viewed along the z-axis, where the sum of the displacements of all points of shallow p-well 225 is zero. As shown in the illustrated embodiment of FIG. 2, centerline 227 is a centerline of shallow p-well 225 and deep p-well 230. That is, shallow p-well 225 and deep p-well 230 include centerlines which are coincident with one another.

Imaging pixel 200 is one possible implementation of center pixel Pc of pixel array 105 in FIG. 1. During operation, incident light that is received at or near the center of pixel array 105 is generally normal (i.e., perpendicular) to back surface 209 of substrate 205. Light that is normal to back surface 209 of imaging pixel 200 may continue propagating through the photodiode region until it is absorbed either within deep n-region 215 or within shallow n-region 210. However, light that is received away from the center of pixel array 105 (e.g., at pixels P1, P2, P3, etc) is generally not normal (i.e., not perpendicular) to back surface 209 of substrate 205. Conventional pixel arrays may include imaging pixels with aligned components, such as imaging pixel 200, for the entire array. That is, pixels located away from the center of a conventional pixel array may have aligned components, such as imaging pixel 200.

Figure 3:
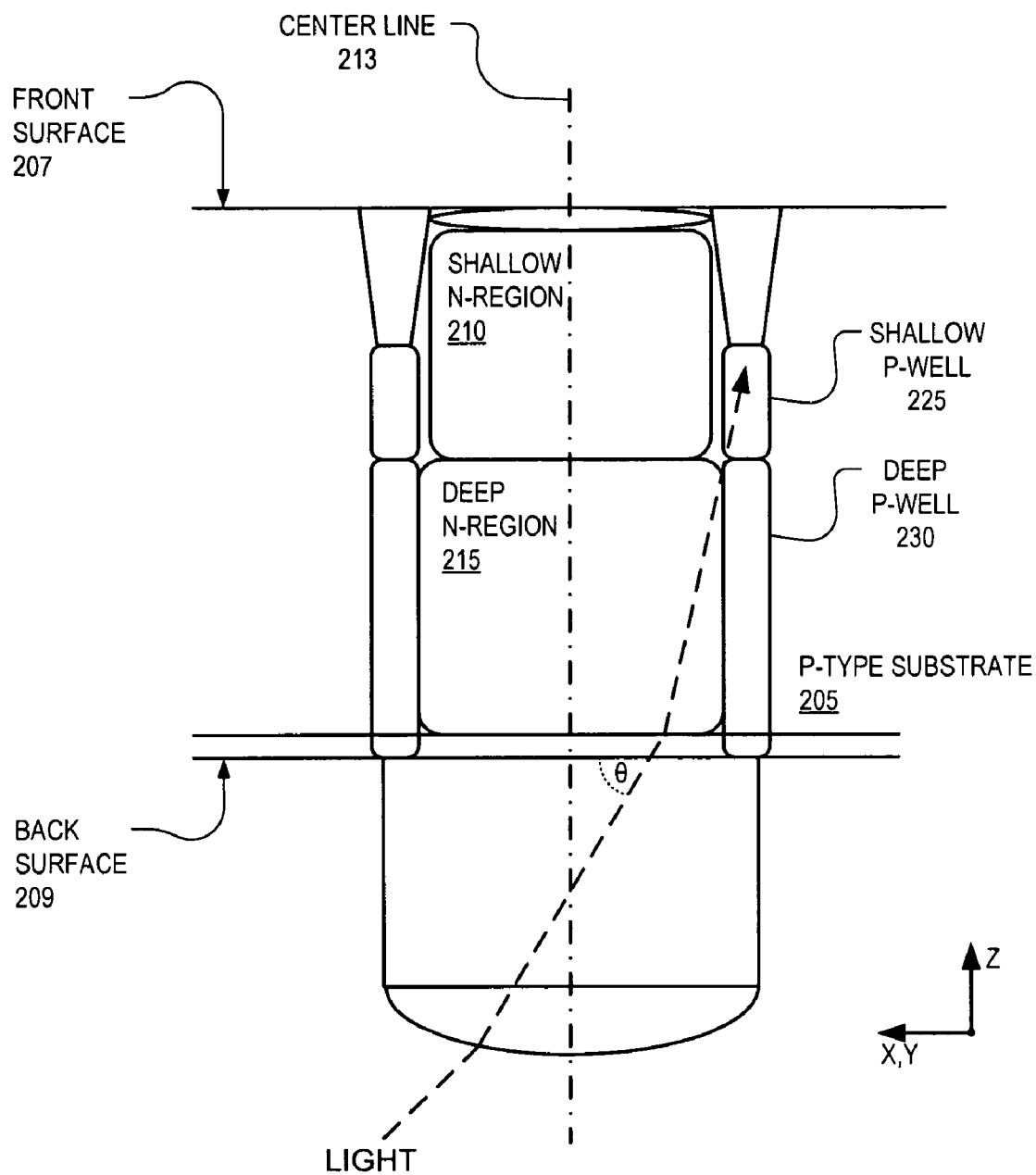
FIG. 3 is a cross-sectional view of an imaging pixel of a conventional backside illuminated imaging sensor, where the pixel is located away from the center of the pixel array.

FIG. 3 illustrates an example of light being received by a conventional pixel array at a pixel having aligned components (i.e., pixel 200) where the pixel is located away from the center of the pixel array such that the received light is at a tilt angle θ with respect to back surface 209. In one embodiment, light incident upon back surface 209 at tilt angle θ is generally non-perpendicular to back surface 209. As shown, light that is received at a tilt angle θ may never reach shallow n-region 210. Instead, the angled light may pass through deep n-region 215 and into the isolation region (e.g., shallow p-well 225 and deep p-well 230). In one example, light being absorbed in the isolation region will result in electrons being photo-generated that may diffuse into a neighboring pixel (not shown). In another example, light may pass completely through the isolation region and may be scattered into a neighboring pixel which may contribute directly to a signal in the neighboring pixel.

In one example, imaging sensor 100 of FIG. 1 is a color imaging sensor that includes imaging pixels for detecting blue light and imaging pixels for detecting red light. Because red light is absorbed deeper into the photodiode than blue light, red sensitivity may drop faster from the center of array 105 to the edge of the array if imaging pixels with aligned components, such as imaging pixel 200, were used for the entire array. The resulting image produced by a pixel array with all imaging pixels 200 may be one with a blueish tone near the edges of the image. As the density of the image sensor increases, so may the reduction in red sensitivity for pixels away from the center of the array.

Accordingly, embodiments of the present invention include offsetting various elements of an imaging pixel to compensate for incident light that is received at a tilt angle θ. Because the title angle θ may be different for pixels near the center of a pixel array than it is for pixels away from the center of the array, embodiments of the present invention further include offsetting various elements of each imaging pixel by distances relative to the pixel's distance from the center of the pixel array. Thus, imaging sensors in accordance with the present invention may increase the sensitivity of imaging pixels at the array edge and reduce cross-talk.

Figure 4:
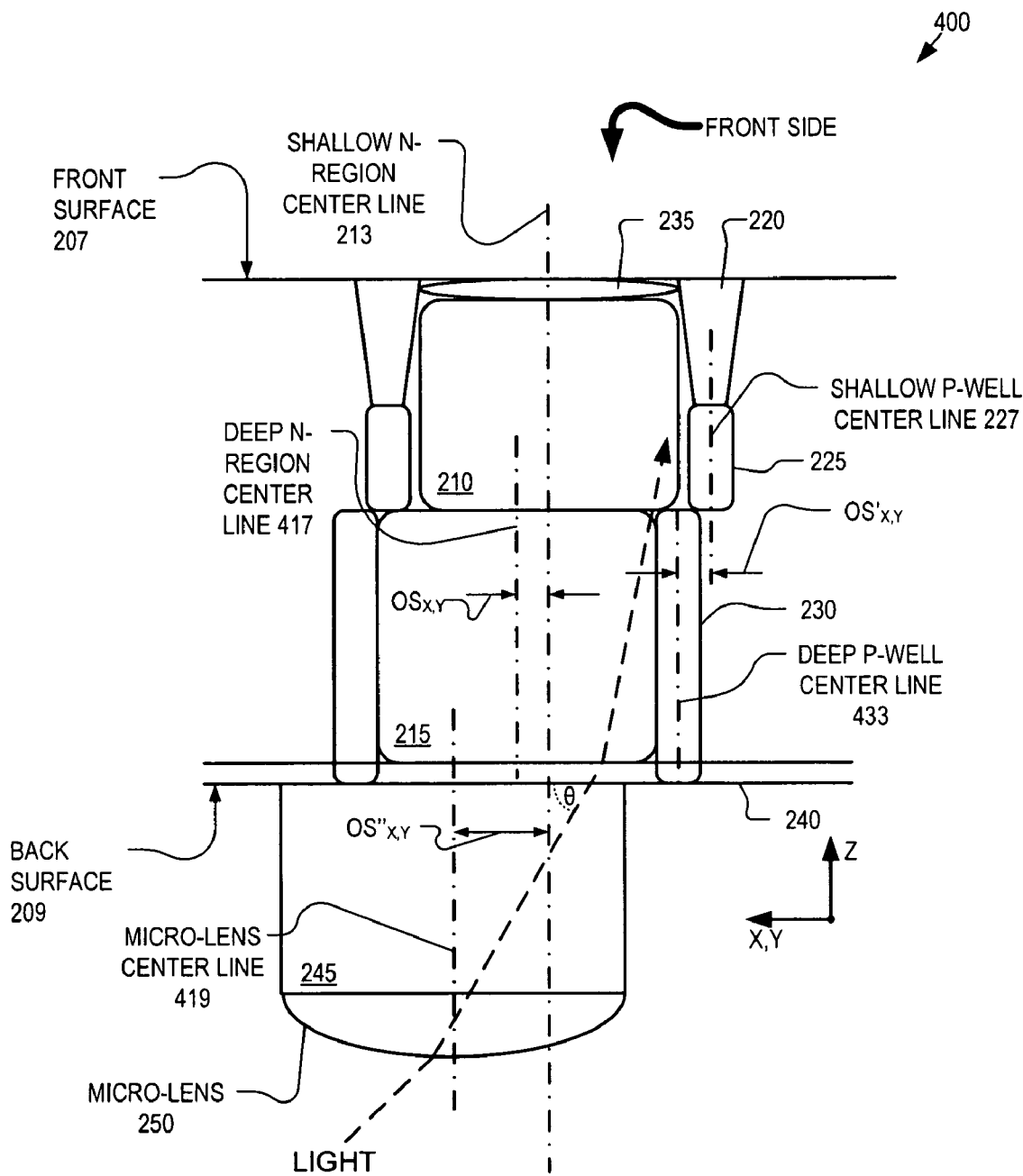
FIG. 4 is a cross-sectional view of an imaging pixel of a backside illuminated imaging sensor, in accordance with an embodiment of the invention.

FIG. 4 is a cross-sectional view of an imaging pixel 400 of a backside illuminated imaging sensor, in accordance with an embodiment of the invention. Imaging pixel 400 is one possible implementation of at least one pixel of pixel array 105, shown in FIG. 1. The illustrated example of imaging pixel 400 includes p-type substrate 205, a photodiode region (e.g., shallow n-region 210 and deep n-region 215), an isolation region (e.g., shallow trench isolations ("STI") 220, shallow p-well 225, and deep p-well 230), pinning layer 235, passivation layer 240, color filter 245, and micro-lens 250.

As with imaging pixel 200 of FIG. 2, shallow n-region 210 of imaging pixel 400 also includes centerline 213. However, as shown in FIG. 4, deep n-region 215 is offset from centerline 213. In one embodiment deep n-region 215 includes a deep n-region centerline 417 that is independent of centerline 213. Deep n-region 215 may be offset from shallow n-region 210 by a distance $OS_{X,Y}$, which, in one embodiment, may be the distance between centerline 213 and centerline 417. Deep n-region 215 may be offset from centerline 213 with respect to one or more axes. For example, deep n-region 215 may be offset from centerline 213 with respect to the x-axis only, with respect the y-axis only, or with respect to both the x and y axes. In one embodiment, deep n-region 215 is offset from centerline 213 with respect to one axis, but substantially coincident with centerline 214 with respect to another axis (e.g., offset on x-axis, but aligned on y-axis).

FIG. 4 further illustrates, shallow p-well 225 as including centerline 227 and deep p-well 230 as including a deep p-well centerline 433. As shown in FIG. 4, deep p-well 230 is offset from centerline 227. Deep p-well 230 may be offset from centerline 227 by a distance $OS'_{X,Y}$, which, in one embodiment, may be the distance between centerline 227 and centerline 433. Deep p-well 230 may be offset from centerline 227 with respect to one or more axes. For example, deep p-well 230 may be offset from centerline 227 with respect to the x-axis only, with respect the y-axis only, or with respect to both the x and y axes. In one embodiment, deep p-well 230 is offset from centerline 227 by the same distance that deep n-region 215 is offset from centerline 213. (e.g., $OS_{X,Y} = OS'_{X,Y}$).

Still referring to FIG. 4, micro-lens 250 is illustrated as being offset from centerline 213. In one embodiment micro-lens 250 includes a micro-lens centerline 419 that is independent of centerline 213. Micro-lens 250 may be offset from centerline 213 by a distance $OS''_{X,Y}$, which, in one embodiment, may be the distance between centerline 213 and centerline 419. Micro-lens 250 may be offset from centerline 213 with respect to one or more axes. For example, micro-lens 250 may be offset from centerline 213 with respect to the x-axis only, with respect the y-axis only, or with respect to both the x and y axes. In one embodiment, micro-lens 250 is offset from centerline 213 by a distance that is greater than the distance that deep n-region 215 is offset from centerline 213 (e.g., $OS''_{X,Y} > OS_{X,Y}$).

Imaging pixel 400 is one possible implementation of a pixel away from the center of pixel array 105 in FIG. 1 (e.g., pixel P1, P2, P3, etc.). During operation, incident light that is received away from the center of pixel array 105 is at a title angle θ relative to back surface 209. Because micro-lens 250 and deep n-region 215 are offset with respect to shallow n-region center line 213, the photodiode region may better match the incoming light path. As a result, light that continues propagating through deep n-region 215 may continue into shallow n-region 210 to be absorbed.

Figure 5:
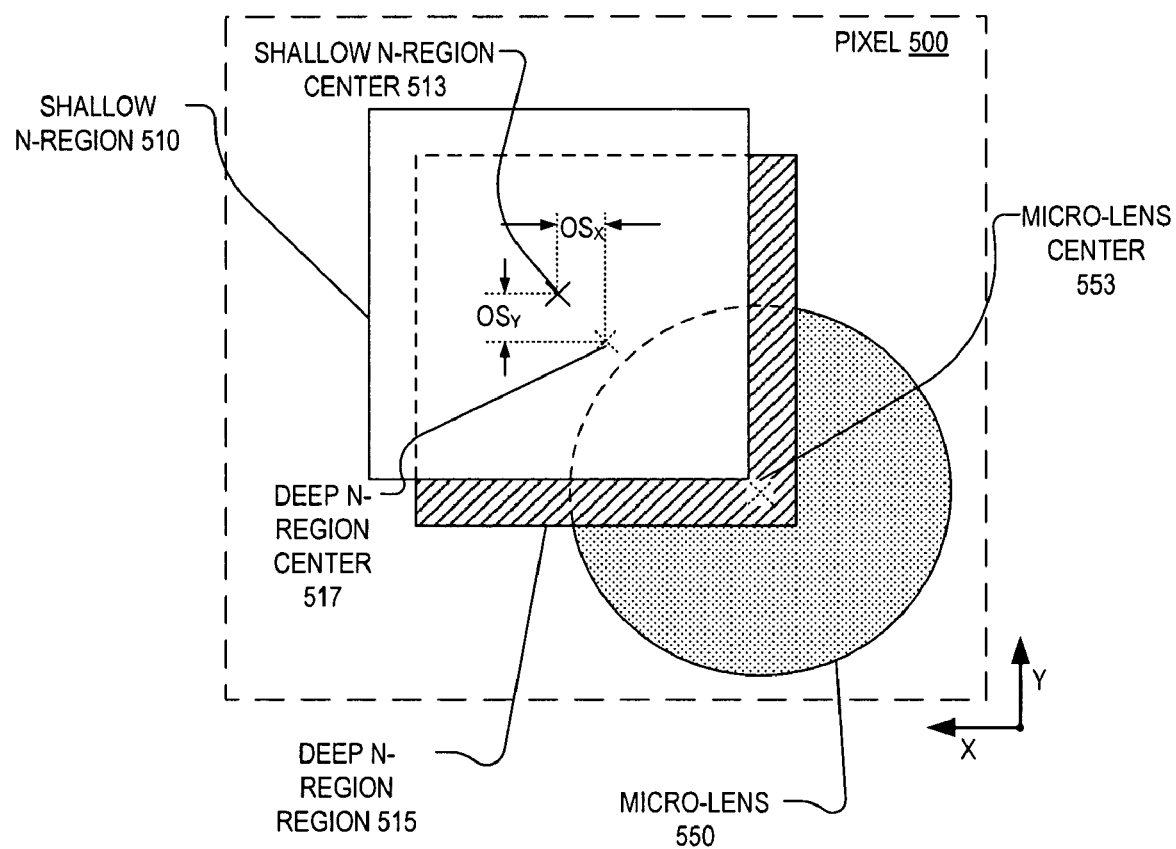
FIG. 5 is a block diagram illustrating a front side view of an imaging pixel of a backside illuminated imaging sensor, in accordance with an embodiment of the invention.

FIG. 5 is a block diagram illustrating a front side view of an imaging pixel 500 of a backside illuminated imaging sensor, in accordance with an embodiment of the invention. Imaging pixel 500 is one possible implementation of at least one pixel of pixel array 105, shown in FIG. 1 and of imaging pixel 400, shown in FIG. 4. The illustrated embodiment of imaging pixel 500 includes a shallow n-region 513, a deep n-region 515, and a micro-lens 550.

As shown in the illustrated embodiment of FIG. 5, shallow n-region 510 includes a center 513, deep n-region 515 includes a center 517, and micro-lens 550 includes a center 553. In one embodiment, centers 513, 517 and 553 correspond to centerlines 213, 417, and 419, respectively, as shown in FIG. 4. FIG. 5 further illustrates that deep n-region 515 may be offset from center 513 along both the x and y axes. In one embodiment, the offset of deep n-region 515 may be taken as the x and y distances between center 513 and center 517. For example, FIG. 5 illustrates deep n-region 515 as having an offset distance of $OS_X$ along the x-axis and of $OS_Y$ along the y-axis. Deep n-region 515 may be offset about one or more axes.

Figure 6:
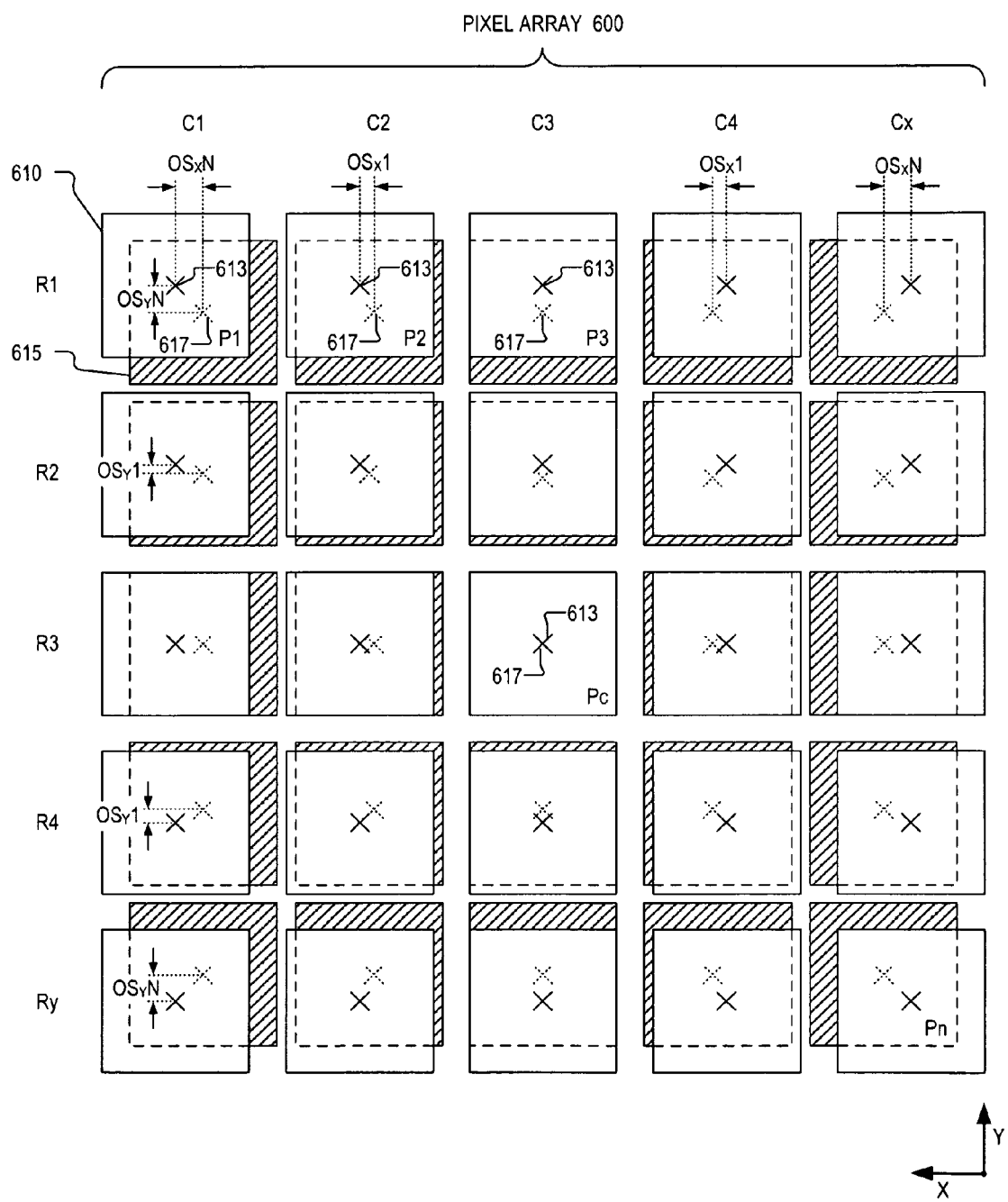
FIG. 6 is a block diagram illustrating a front side view an array of imaging pixels of a backside illuminated imaging sensor, in accordance with an embodiment of the invention.

FIG. 6 is a block diagram illustrating a front side view of an array 600 of imaging pixels of a backside illuminated imaging sensor, in accordance with an embodiment of the invention. Pixel array 600 is one possible implementation of pixel array 105, shown in FIG. 1. In one embodiment, each pixel of imaging array 600 is at least one of the imaging pixels disclosed herein. For example, pixel Pc may be imaging pixel 200 of FIG. 2 and pixels P1, P2, P3 and Pn may each be an embodiment of imaging pixel 400 of FIG. 4.

The illustrated embodiment of pixel array 600 is a two-dimensional ("2D") array of backside illuminated imaging sensors or pixels (e.g., pixels P1, P2 . . . , Pn). As illustrated, each pixel is arranged into a row (e.g., rows R1 to Ry) and a column (e.g., column C1 to Cx). Pixel Pc is illustrated as a center pixel of pixel array 600. Each pixel of pixel array 600 includes a shallow n-region 610 (i.e., illustrated as non-shaded regions) and a deep n-region 615 (i.e., illustrated as shaded regions). Furthermore, each shallow n-region 610 is illustrated as including a center 613 and each deep n-region 615 is illustrated as including a center 617.

As mentioned above, the tilt angle θ of incident light upon the back surface of each pixel may change in relation to the distance that each pixel is from the center (e.g., pixel Pc) of pixel array 600. Thus, the illustrated embodiment of pixel array 600 includes offsetting some of the deep n-regions 615 by a distance responsive to their respective pixels distance from the center of pixel array 600.

For example, center pixel Pc includes no offset of its deep n-region 615. In one embodiment, center 613 and center 617 of center pixel Pc are substantially coincident. Center pixel Pc may include no offset because, as mentioned above, light that is incident at or near the center of the array is generally normal to the back surface. Thus, no offset may be needed.

However, for pixels that are away from center pixel Pc, light incident on these pixels may be at a tilt angle θ. Thus, each pixel in pixel array 600 that is away from center pixel Pc may include an offsetting of deep n-region 615 to compensate for each respective tilt angle θ. In one embodiment, each pixel in pixel array 600 that is away from center pixel Pc includes a deep n-region 615 that is offset towards the center pixel Pc.

For example, deep n-region 615 of pixel P2 is offset towards center pixel Pc such that center 617 is closer to center pixel Pc than center 613.

As shown in FIG. 6, pixel array 600 includes a center column C3 and a center row R3 of pixels. In this embodiment, pixels on center column C3 or center row R3 may include a deep n-region 615 that is only offset along one axis. For example, pixel P3 includes a deep n-region 615 that is offset only along the y-axis and is substantially in alignment with respect to the x-axis.

As is further shown in FIG. 6, pixels of pixel array 600 that are further away from center pixel Pc include deep n-regions 615 that are offset by a greater distance than those pixels which are located closer to center pixel Pc. For example, pixels that are located in column C1 may include deep n-regions 615 that are offset along the x-axis by a greater distance than those located in column C2. By way of further example, pixel P2 includes a deep n-region 615 that has an x-axis offset of $OS_X1$ while pixel P1 includes a deep n-region 615 that has an x-axis offset of $OS_XN$, where $OS_XN > OS_X1$. In one embodiment, the x-axis offset $OS_X$ and the y-axis offset $OS_Y$ of all pixels in pixel array 600 range from approximately 0 microns to approximately 0.5 microns.

Furthermore, some of the imaging pixels of pixel array 600 may include a deep n-region 615 that is offset along the x and y axes by the same distance. For example, pixel P1 includes deep n-region 615 that may be offset along the x-axis by a distance $OS_XN$ and along the y-axis by a distance $OS_YN$, where $OS_XN = OS_YN$.

Figure 7:
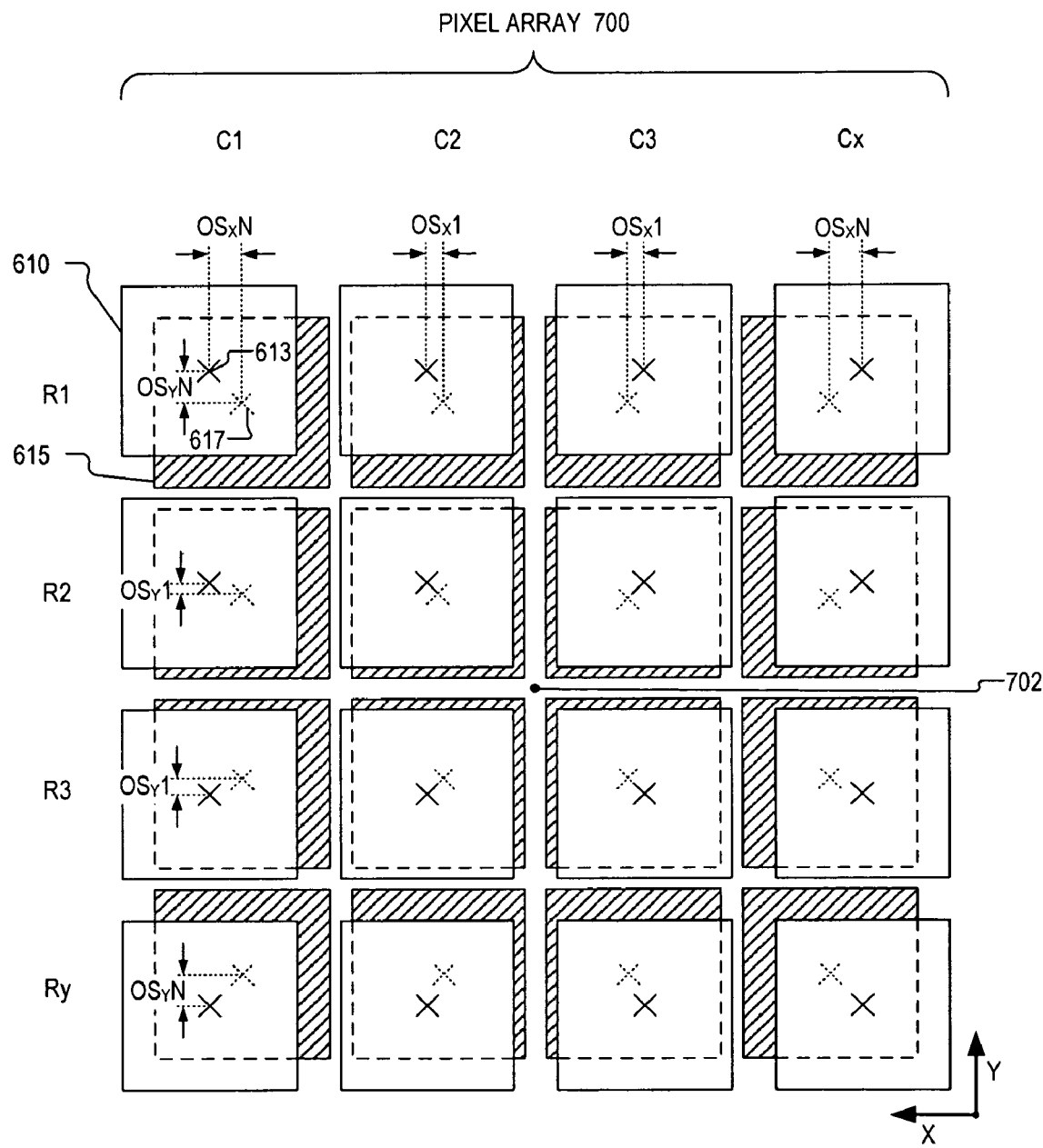
FIG. 7 is a block diagram illustrating a front side view of an array of imaging pixels of a backside illuminated imaging sensor, in accordance with an embodiment of the invention.

FIG. 7 is a block diagram illustrating an array 700 of imaging pixels of a backside illuminated imaging sensor, in accordance with an embodiment of the invention. Pixel array 700 is one possible implementation of pixel array 105, shown in FIG. 1. In one embodiment, each pixel of imaging array 700 is an embodiment of imaging pixel 400 of FIG. 4. Pixel array 700 is similar to imaging array 600 of FIG. 6, but pixel array 700 includes an even number of columns and rows and thus does not include a center pixel Pc. Thus, in one embodiment the amount of offsetting of each deep n-region 615 may correspond to the distance each pixel is from a center point 702. In one embodiment pixel array 700 only includes pixels that include a deep n-region 615 that is offset with respect to both the x and y axes. That is, pixel array 700, in this embodiment, may not include any pixels that include a deep n-region 615 that is aligned along either the x or y axes.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging pixel, comprising:
a semiconductor layer having a front surface and a back surface;
a photodiode region formed in the semiconductor layer, wherein the photodiode region includes:
a first n-region having a centerline; and
a second n-region disposed between the first n-region and the back surface of the semiconductor layer, wherein the second n-region is offset from the centerline of the first n-region by a first distance; and
an isolation region formed in the semiconductor layer disposed adjacent to the photodiode region, wherein the isolation region includes:
a first p-well having a centerline; and
a second p-well disposed between the first p-well and the back surface of the semiconductor layer, wherein the second p-well is offset from the centerline of the first p-well by a second distance.

2. The backside illuminated imaging pixel of claim 1, wherein the first and second distances are substantially equal.

3. The backside illuminated imaging pixel of claim 1, further comprising a micro-lens disposed on the back surface of the semiconductor layer below the photodiode region, wherein the micro-lens is offset from the centerline of the first n-region.

4. The backside illuminated imaging pixel of claim 3, wherein the second n-region is offset from the centerline of the first n-region by the first distance and wherein the micro-lens is offset from the centerline of the first n-region by a third distance.

5. The backside illuminated imaging pixel of claim 4, wherein the first distance is less than the third distance.

6. The backside illuminated imaging pixel of claim 3, further comprising a color filter disposed between the micro-lens and the photodiode region.

7. The backside illuminated imaging sensor of claim 1, wherein the imaging pixel is a complementary metal-oxide-semiconductor ("CMOS") backside illuminated imaging pixel.

8. An imaging sensor, comprising:
a semiconductor layer having a front surface and a back surface, the semiconductor layer having a backside illuminated array of imaging pixels which includes a first imaging pixel, the first imaging pixel including a first photodiode region and an isolation region formed in the semiconductor layer, wherein the first photodiode region includes:
a first n-region having a centerline; and
a second n-region disposed between the first n-region and the back surface of the semiconductor layer, wherein the second n-region is offset from the centerline of the first n-region by a first distance; and
wherein the isolation region is disposed adjacent to the photodiode region and includes:
a first p-well having a centerline; and
a second p-well disposed between the first p-well and the back surface of the semiconductor layer, wherein the second p-well is offset from the centerline of the first p-well.

9. The imaging sensor of claim 8, wherein the first imaging pixel further includes a micro-lens disposed on the back surface of the semiconductor layer below the photodiode region, wherein the micro-lens is offset from the centerline of the first n-region by a second distance.

10. The imaging sensor of claim 9, wherein the first distance is less than the second distance.

11. The imaging sensor of claim 9, wherein the first imaging pixel further includes a color filter disposed between the micro-lens and the photodiode region.

12. The imaging sensor of claim 10, wherein the array of imaging pixels further includes a second imaging pixel, the second imaging pixel including:

a second photodiode region formed in the semiconductor layer, wherein the second photodiode region includes:
a third n-region having a centerline; and
a fourth n-region disposed between the third n-region and the back surface of the semiconductor layer, wherein the fourth n-region is offset from the centerline of the third n-region by a distance that is greater than the first distance.

13. The imaging sensor of claim 12, wherein the second imaging pixel is disposed further away from a center of the array than the first imaging pixel.

14. The imaging sensor of claim 8, wherein the array of imaging pixels further includes a third imaging pixel, the third imaging pixel including:
a third photodiode region formed in the semiconductor layer, wherein the third photodiode region includes:
a fifth n-region having a centerline; and
a sixth n-region disposed between the fifth n-region and the back surface of the semiconductor layer, wherein the sixth n-region has a centerline that is substantially coincident with the centerline of the fifth n-region.

15. The imaging sensor of claim 14, wherein the third imaging pixel is a center pixel of the array of imaging pixels.

16. The imaging sensor of claim 8, wherein each imaging pixel is a complementary metal-oxide-semiconductor ("CMOS") backside illuminated imaging pixel.

17. The imaging sensor of claim 8, wherein the second n-region is offset from the centerline of the first n-region towards a center of the array, such that a centerline of the second n-region is closer to the center of the array than the centerline of the first n-region.

18. The imaging sensor of claim 8, wherein the second n-region is offset from the centerline of the first n-region towards a center of the array along a first axis of the array and is substantially in alignment with the centerline of the first n-region along a second axis of the array.

19. The imaging sensor of claim 18, wherein the first imaging pixel is a pixel located in a center column or a center row of the array.

* * * * *